(12) United States Patent
Strauss

(10) Patent No.: US 7,687,205 B2
(45) Date of Patent: Mar. 30, 2010

(54) PHOTOLITHOGRAPHIC METHOD AND APPARATUS EMPLOYING A POLYCHROMATIC MASK

(75) Inventor: Dennis R. Strauss, Ventura, CA (US)

(73) Assignee: The Boeing Company, Chicago, IL (US)

( * ) Notice: Subject to any disclaimer, the term of this patent is extended or adjusted under 35 U.S.C. 154(b) by 749 days.

(21) Appl. No.: 11/453,707

(22) Filed: Jun. 15, 2006

(65) Prior Publication Data

US 2007/0292770 A1 Dec. 20, 2007

(51) Int. Cl.
*G03F 1/00* (2006.01)

(52) U.S. Cl. .................. 430/5; 430/311; 355/53; 355/69

(58) Field of Classification Search ............ 430/5, 430/311; 355/53, 69
See application file for complete search history.

(56) References Cited

U.S. PATENT DOCUMENTS

| | | | | |
|---|---|---|---|---|
| 3,829,213 A | * | 8/1974 | Payne ............ | 355/79 |
| 5,501,926 A | * | 3/1996 | Cheng et al. ............ | 430/5 |
| 6,753,131 B1 | * | 6/2004 | Rogers et al. ............ | 430/322 |
| 6,967,779 B2 | * | 11/2005 | Fadel et al. ............ | 359/619 |
| 2004/0027675 A1 | | 2/2004 | Wu et al. | |
| 2005/0053844 A1 | * | 3/2005 | Wu ............ | 430/5 |
| 2006/0103827 A1 | * | 5/2006 | Derksen ............ | 355/67 |
| 2007/0269750 A1 | * | 11/2007 | Irving et al. ............ | 430/322 |

* cited by examiner

*Primary Examiner*—Mark F Huff
*Assistant Examiner*—Rashid Alam
(74) *Attorney, Agent, or Firm*—Alston & Bird LLP

(57) ABSTRACT

A photolithographic method and associated apparatus are provided that permit three-dimensional structures to be defined in a photoresist coating in such a manner that multi-level structures can be formed which have constant width at different depths within the photoresist coating. The photolithographic method and apparatus may permit such three-dimensional structures to be defined within a photoresist coating with the use of a single polychromatic mask and, optionally, a micro-lens array. By designing the polychromatic mask to have a plurality of regions that selectively pass and block respective wavelengths of light, the photoresist coating can be selectively illuminated with light have different wavelengths. As a result of the optical absorption characteristics of the photoresist coating, the different wavelengths of light propagate to different depths within the photoresist coating, thereby defining multi-level microstructures therein.

28 Claims, 4 Drawing Sheets

PHOTOLITHOGRAPHIC METHOD AND APPARATUS EMPLOYING A POLYCHROMATIC MASK

FIELD OF THE INVENTION

Embodiments of the present invention relate generally to photolithographic methods and apparatus and, more particularly, to photolithographic methods and apparatus that employ a polychromatic mask for defining three-dimensional structures.

BACKGROUND OF THE INVENTION

Photolithographic processes are widely utilized in the fabrication of a variety of microstructures. In this regard, a photoresist coating is generally applied to a substrate. The photoresist coating is then illuminated in a pattern defined by a mask positioned between a source of illumination and the photoresist coating. The photoresist coating is then developed and a portion of the photoresist coating, as defined by the illumination pattern, is selectively removed prior to baking the photoresist coating. Thereafter, the substrate may be etched so as to transfer the pattern defined by the photoresist coating to the substrate in order to define a microstructure therein. The remainder of the photoresist coating is then removed to expose the resulting microstructure.

A variety of microstructures can be formed by photolithographic processes. For example, micro-optic devices can be fabricated, such as gratings, micro-lens arrays and the like, as well as micro-fluidic devices.

Some of the microstructures have depth profiles with multi-level plateaus or multi-level channels that desirably have a constant width. Forming such microstructures with a monochromatic mask (including a gray-scale mask) can be problematic since the light with which the photoresist coating is illuminated is absorbed by the photoresist coating in such a manner that the resulting light intensity varies logarithmically with depth within the photoresist coating. As such, neglecting focusing and diffractive effects, the depth profile defined within a photoresist coating by light that has been filtered by a monochromatic mask would also tend to follow a logarithmic contour. Thus, features that are formed deeper within the photoresist coating tend to be narrower than corresponding features that are designed to have the same size that are formed closer to the surface of the photoresist coating. This narrowing of features formed deeper within a photoresist coating is frequently undesirable since the microstructures are oftentimes designed to, instead, have multi-level features of constant width to facilitate optimum operation.

In order to avoid the narrowing of structures formed deeper within a photoresist coating, the microstructure defined by the photoresist coating could be formed in an iterative manner in which a relatively thin photoresist coating was initially exposed and developed. The recesses formed within the initial photoresist coating could then be filled with a removable filler followed by the deposition, exposure and development of a second photoresist coating. This process could continue for as many layers of photoresist coating as desired. However, the process of filling the recess is defined within each photoresist layer is complex and each overlying photoresist layer must be deposited, exposed and developed in a manner that does not disturb the underlying photoresist layers. Still further, the substrate and each photoresist layer must be precisely aligned during each iteration.

Alternatively, the photoresist layer could be exposed and developed to define microstructures at one-depth. The photoresist coating could then be coated with a passivating layer that is then removed from certain portions of the underlying photoresist layer, such as at the higher portions of the photoresist layer, in which additional microstructures will be defined. Those portion of the photoresist layer from which the passivating layer has been removed are then further exposed through another mask so as to define additional microstructures at a different depth. However, this technique also requires multiple coatings and multiple exposures through a sequence of different masks, each of which must be carefully aligned.

As such, it would be desirable to provide a photolithographic process in which three-dimensional microstructures could be more readily formed in photoresist coatings. Moreover, it would be desirable to provide photolithographic processes for efficiently defining three-dimensional structures within a photoresist coating in such a manner that the resulting microstructures have a constant width at various depths within the photoresist layer.

BRIEF SUMMARY OF THE INVENTION

A photolithographic method and associated apparatus are provided that permit three-dimensional structures to be defined in a photoresist coating in such a manner that multi-level structures can be formed which have constant width at different depths within the photoresist coating. In one embodiment, the photolithographic method and apparatus permit such three-dimensional structures to be defined within a photoresist coating with the use of a single polychromatic mask, thereby avoiding the inefficiencies occasioned by the requisite alignment of a plurality of masks at different steps of an iterative photolithographic process. Moreover, embodiments are provided in which a micro-lens array is utilized in order to focus the light passing through the mask, such as a polychromatic mask, upon the photoresist coating such that the mask can be larger than the resulting microstructure to be defined within the photoresist coating. As such, the mask can be more readily fabricated as a result of its larger size.

In one embodiment, a photolithographic method is provided that initially positions the mask relative to a photoresist coating. The mask defines a plurality of different regions. A first region of the mask permits light of a first wavelength to pass therethrough while blocking light of a second wavelength. Correspondingly, a second region of the mask permits light of a second wavelength to pass therethrough while blocking light of the first wavelength. The photolithographic method of this embodiment also illuminates the mask with light, such as white light, including both the first and second wavelengths such that light having the first and second wavelengths selectively passes through the first and second regions of the mask, respectively. The photolithographic method of this embodiment further includes exposing the photoresist coating to the light of the first and second wavelengths in a pattern defined by the mask. The different wavelengths of light are absorbed differently by the photoresist coating and, therefore, propagate different distances into the photoresist coating. In this regard, the light of the first wavelength is absorbed less by the photoresist coating than the light of the second wavelength. Consequently, the light of the first wavelength propagates further into the photoresist coating than the light of the second wavelength. As a result, the first and second wavelengths of light are advantageously selected based, at least in part, upon the optical absorption characteristics of the photoresist coating so as to ensure that light having the first and second wavelengths will penetrate to different depths within the photoresist coating.

Following exposure of the photoresist coating, the photoresist coating may be developed and then a portion of the photoresist coating may be removed. In this regard, the portion of the photoresist coating that is removed is dependent upon the manner in which the photoresist coating has been exposed to light having the first and second wavelengths. The remaining portions of the photoresist coating define a three-dimensional structure. The photoresist coating can then be baked. Once baked, the three-dimensional structure defined by the photoresist coating can be transferred to an underlying substrate in a variety of manners including etching or ion milling in order to form a corresponding microstructure within the substrate. Additionally, a mold of the three-dimensional structure defined by the photoresist coating can be created in order to permit ready transfer of the three-dimensional structure to other polymer coatings.

In one embodiment of the method, a micro-lens array is employed in tandem with the polychromatic mask. In this regard, a micro-lens array is positioned to receive light including the first and second wavelengths following propagation of the light through the mask. The micro-lens array serves to focus the light upon the photoresist coating. As a result of the focusing provided by the micro-lens array, the mask can be larger than the resulting microstructure defined within the photoresist coating, thereby facilitating the fabrication of the mask.

In addition to photolithographic methods for defining various microstructures within a photoresist coating, a photolithographic apparatus is provided in accordance with another embodiment of the present invention. The photolithographic apparatus includes a polychromatic mask and a micro-lens array positioned to receive light passing through the polychromatic mask and to focus the light upon a photoresist coating. The polychromatic mask defines a plurality of different regions with a first region of the mask configured to permit light of a first wavelength to pass therethrough while blocking light of a second wavelength and a second region of the mask configured to permit light of the second wavelength to pass therethrough while blocking light of the first wavelength. The micro-lens array is positioned to receive light including the first and second wavelengths following propagation through the polychromatic mask and is configured to focus the light upon a photoresist coating. By employing a micro-lens array, the polychromatic mask can be larger than the microstructure to be defined within the photoresist layer. As such, the polychromatic mask can be more readily fabricated. In one embodiment, for example, the polychromatic mask is formed of a transparent substrate with the first and second regions having first and second colors, respectively.

BRIEF DESCRIPTION OF THE SEVERAL VIEWS OF THE DRAWING(S)

Having provided a brief summary of the invention, reference will now be made to the accompanying drawings, which are not necessarily drawn to scale, and wherein.

DETAILED DESCRIPTION OF EXEMPLARY EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein. Rather, these embodiments are provided so that this disclosure will satisfy applicable legal requirements. Like numbers refer to like elements throughout.

Figure 1:
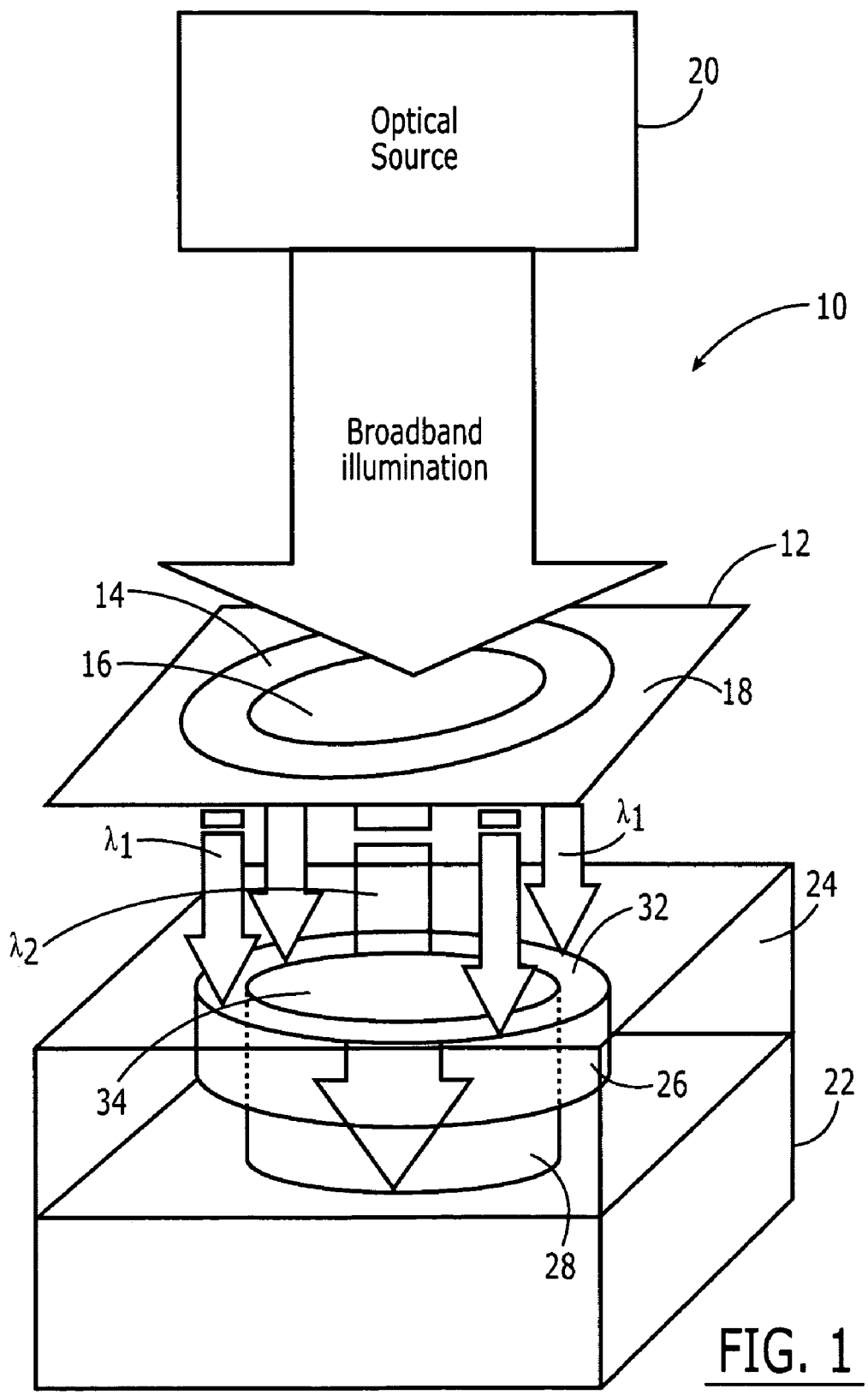
FIG. 1 is a schematic representation of a photolithographic apparatus according to one embodiment of the present invention.

Referring now to FIG. 1, a photolithographic apparatus 10 is depicted in accordance with one embodiment of the present invention. The photolithographic apparatus includes a polychromatic mask 12 defining a plurality of different regions. These regions are defined to selectively pass certain wavelengths of light, while blocking or filtering out other wavelengths of light. In the embodiment depicted in FIG. 1, the polychromatic mask includes three different regions. A first region 14 has an annular shape and is configured to permit light of a first wavelength to pass therethrough while blocking light having other wavelengths. The polychromatic mask also includes a second region 16 that is configured to permit light of a second wavelength to pass therethrough while blocking light having other wavelengths. In this regard, among the wavelengths of light that are blocked by the first region of the mask is the second wavelength of light that is passed by the second region. Conversely, among the wavelengths of light that are blocked by the second region of the mask is the first wavelength of light that is passed by the first region. Thus, the first and second regions of the polychromatic mask of the illustrated embodiment are mutually exclusive in that each region allows a wavelength of light to pass that is blocked by the other region.

In the foregoing description, the first and second regions 14, 16 were described to pass first and second wavelengths of light, respectively. While the first and second regions could be designed to pass a single respective wavelength of light, the first and second regions typically pass first and second ranges or bands of wavelengths. Accordingly, the first region of the mask 12 generally passes a first band of wavelengths while blocking a second band of wavelengths, while the second region of the mask generally passes the second band of wavelengths while blocking the first band of wavelengths. For purposes of explanation but not of limitation, however, the first and second regions of the mask will be generally described herein as selectively passing light having first and second wavelengths, respectively. Moreover, while the photolithographic mask of the embodiment of FIG. 1 includes first and second regions for selectively passing first and second wavelengths of light, respectively, the photolithographic mask could include any number of regions which selectively pass respective wavelengths of light while blocking the propagation of other wavelengths of light.

The photolithographic mask 12 of the embodiment of FIG. 1 also includes a peripheral portion 18 which serves to block all wavelengths of light so as to define the boundary of the illumination pattern. The mask need not have such a peripheral portion, however, and the wavelength selective regions can, instead, extend to the edge of the mask in other embodiments While the first and second regions 14, 16 of the photolithographic mask of the embodiment of FIG. 1 define a circular or bulls-eye type of pattern, the regions defined by the photolithographic mask can be of various shapes and sizes and can define a wide range of different patterns without departing from the spirit and scope of the present invention.

The polychromatic mask 12 can be fabricated in a number of different manners. In one embodiment, the polychromatic mask includes a transparent substrate which defines the plurality of different regions by differently coloring the respective regions. In this regard, the first region could have a first color and the second region could have a second color. The color of the respective regions defines the wavelengths of light that will be passed through or blocked by the region. In this regard, a filter that appears blue in transmission passes light in the blue portion of the spectrum, but absorbs light in other portions of the spectrum, such as the green, yellow, orange and red portions of the spectrum.

As shown in FIG. 1, the photolithographic apparatus 10 includes an optical source 20 for illuminating the polychromatic mask. The optical source generally provides relatively broadband illumination and, in one embodiment, is a white light source. The optical source illuminates the polychromatic mask 12 such that the first and second regions 14, 16 selectively pass light having the first and second wavelengths, respectively. In the embodiment depicted in FIG. 1, for example, light having the first wavelength that passes through the first region is designated $\lambda_1$, while the light having the second wave photolithographic length that passes through the second region is designated as $\lambda_2$.

The photolithographic apparatus 10 and, in particular, the polychromatic mask 12 is generally positioned proximate to a substrate 22 having a photoresist coating 24 applied thereto. As such, the light which propagates through the polychromatic mask, such as light having the first and second wavelengths, is incident upon the photoresist coating. The photoresist may coat a variety of substrates, such as semiconductor substrates or the like, depending upon the type of microstructure to be fabricated. The photoresist coating can be formed of any of a wide variety of photosensitive materials. Typically, the photoresist coating is photosensitive to, but has different optical absorption for light having different wavelengths. In this regard, the photoresist coating absorbs light differently depending upon its wavelength. As shown by way of an example in FIG. 2, the absorption spectrum of one exemplary photoresist is shown to absorb light having the first wavelength more readily than light having the second wavelength. As such, light having the second wavelength will penetrate more deeply into the photoresist coating than light having the first wavelength. Typically, photoresist coatings comprised of a photosensitive polymer have higher optical densities for light having shorter wavelengths than for light having longer wavelengths such that the depth of penetration of light having the shorter wavelengths is less than the penetration of light having longer wavelengths as exemplified by FIG. 2. For example, one suitable photoresist is I Line and G Line photoresist that is photosensitive both to light having a wavelength of 365 nm and light having a wavelength of 436 nm. However, I Line and G Line photoresist absorbs light having a wavelength of 365 nm more readily than light having a wavelength of 436 nm.

As shown in FIG. 1, the first region 14 of the polychromatic mask 12 permits light having a first wavelength to pass therethrough and be incident upon the photoresist coating 24. Since the photoresist coating has a relatively high optical density for light having the first wavelength, the light having the first wavelength that is incident upon the photoresist coating does not penetrate very deep within the photoresist coating. Conversely, the second region of the polychromatic mask permits light having the second wavelength to pass therethrough and be incident upon the photoresist layer. Since the optical density of the photoresist coating for light having the second wavelength is substantially less than the optical density of the photoresist coating for light having the first wavelength, light having the second wavelength penetrates more deeply within the photoresist coating prior to being absorbed. The relative degrees of penetration of light having the first and second wavelengths are shown in FIG. 1 by the regions designated 26 and 28, respectively.

Figure 3:
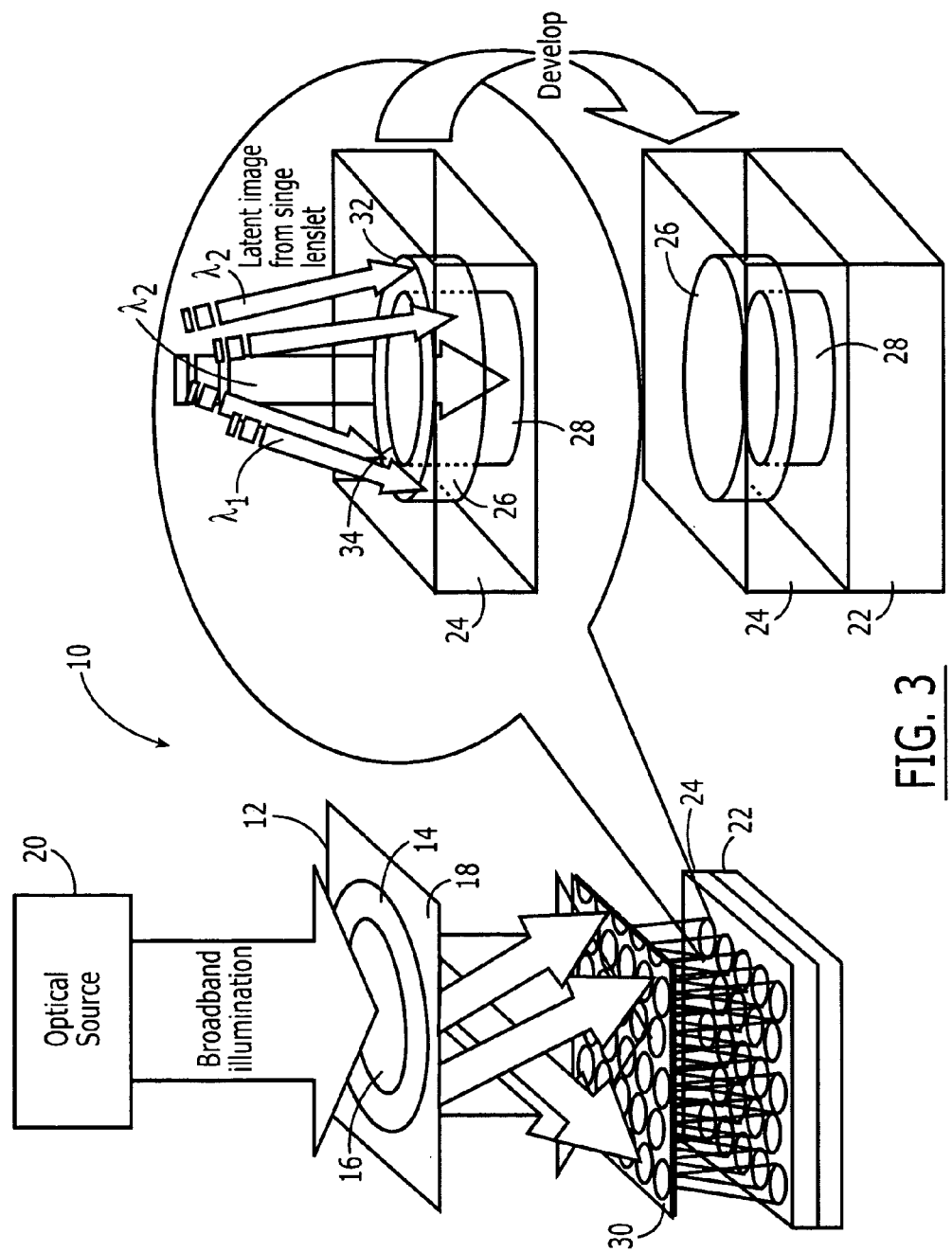
FIG. 3 is a schematic representation of a photolithographic apparatus according to another embodiment of the present invention.

Although the polychromatic mask 12 may be positioned proximate to the photoresist coating 24 such that light passing through the different regions of the polychromatic mask is directly incident upon the photoresist coating, a lens, such as a micro-lens array 30, may be positioned between the polychromatic mask and the photoresist coating in some embodiments, such as shown in FIG. 3. As depicted schematically in FIG. 3 and as known to those skilled in the art, a micro-lens array serves to focus the light incident thereupon upon an underlying surface, such as a photoresist coating. In this regard, each lenslet of a micro-lens array effectively replicates the pattern of light defined by the polychromatic mask so as to define a plurality of three-dimensional structures within the photoresist coating, each having the same pattern (albeit of a smaller size) as defined by the polychromatic mask. In this regard, as shown in the exploded view of the portion of the photoresist coating upon which light from a single lenslet is incident, light having the first wavelength is incident upon an annular region 32 with light having the second wavelength being incident upon the circular region 34 that is circumscribed by the annular region. As such, the pattern defined by the polychromatic mask is replicated a plurality of times, one for each lenslet of the micro-lens array.

Since the lenslets of the micro-lens array 30 define three-dimensional structures within the photoresist coating 24 that have the same pattern, but are much smaller in size than the pattern defined by the polychromatic mask 12, the polychromatic mask can be fabricated with the regions having the desired proportions and relationships in accordance with the desired pattern, but in a much larger overall size than the three-dimensional structures eventually defined within the photoresist coating. The capability of fabricating the polychromatic mask in a larger size is advantageous since the larger size permits the polychromatic mask to be fabricated in a less expensive manner. For example, the polychromatic mask can be formed of a transparent substrate which defines a number of regions, each of which has a respective color to define the wavelength of light that will pass therethrough and the wavelength of light that will be blocked thereby as described above. Since the polychromatic mask can be relatively large in size, the polychromatic mask of one embodiment can be fabricated by imprinting various colored regions upon a transparent substrate with an ink jet printer. Alternatively, the different regions can be colored by hand in a manual operation, if so desired.

Figure 4:
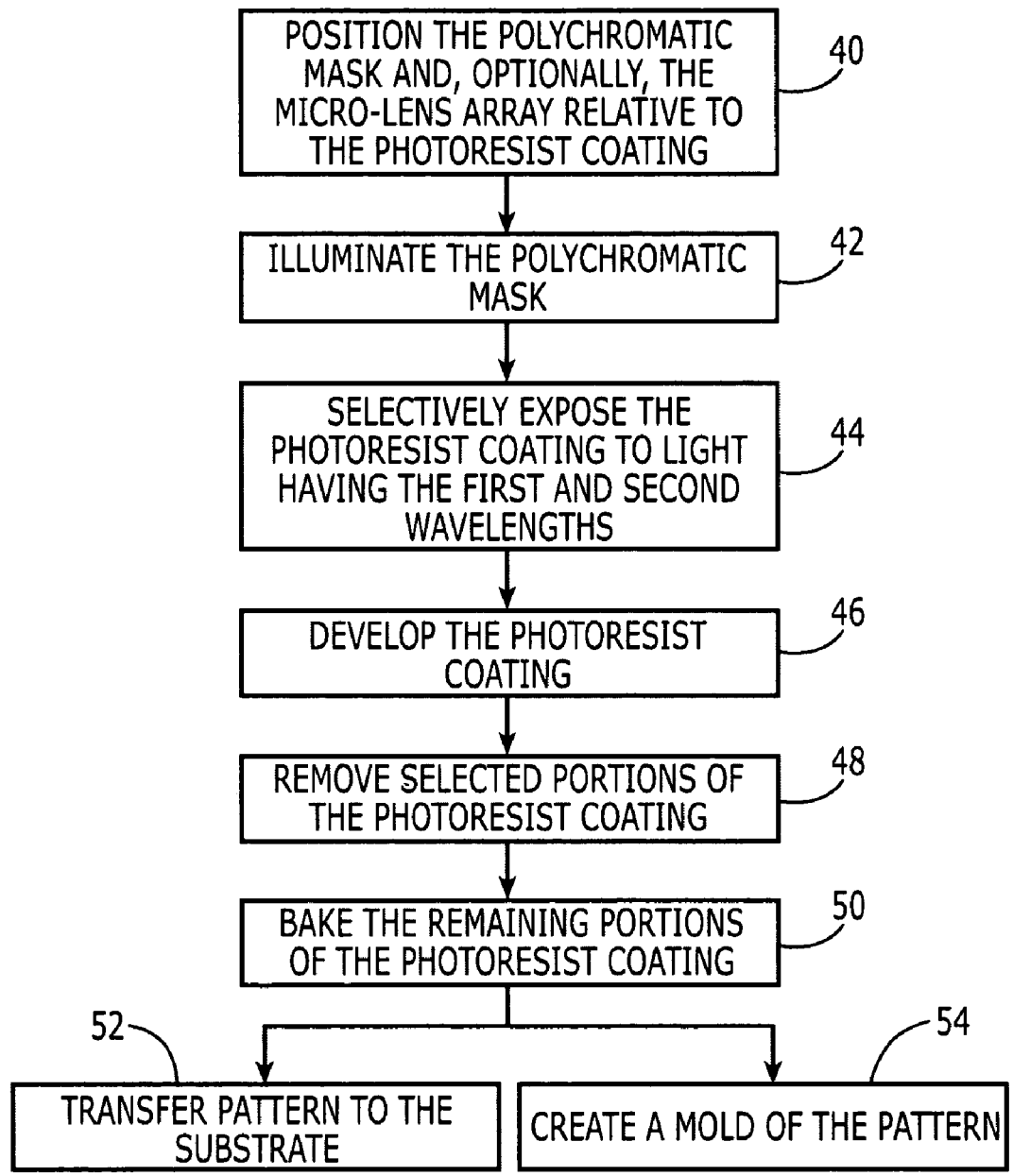
FIG. 4 is a flowchart of a photolithographic process according to one embodiment of the present invention.

Once the polychromatic mask 12 and, optionally, the micro-lens array have been positioned relative to the photoresist coating 24 and the mask and, in turn, the photoresist coating has been illuminated with light having a plurality of different wavelengths as shown in blocks 40, 42 and 44 of FIG. 4, the illumination or exposure of the photoresist layer is discontinued. The photoresist coating may then be developed and a portion of the photoresist coating can be removed. See blocks 46 and 48 of FIG. 2. Typically, the portion of the photoresist coating that is removed is either the portion of the photoresist coating that has been illuminated or the portion of the photoresist coating that has not been illuminated, depending upon whether the photoresist coating is comprised of a positive or negative photosensitive material. Thereafter, the photoresist coating can be baked as shown in block 50. Once the photoresist coating has been baked, the underlying substrate 22 can be processed in accordance with the photoresist coating so as to transfer the three-dimensional structure defined by the photoresist coating into the substrate. See block 52 of FIG. 2. For example, the substrate may be etched or subjected to ion milling. Thereafter, the remainder of the photoresist layer can be removed so as to expose the substrate having the resulting three-dimensional microstructure, such as a micro-optic device or a micro-fluidic device, defined therein.

Figure 2:
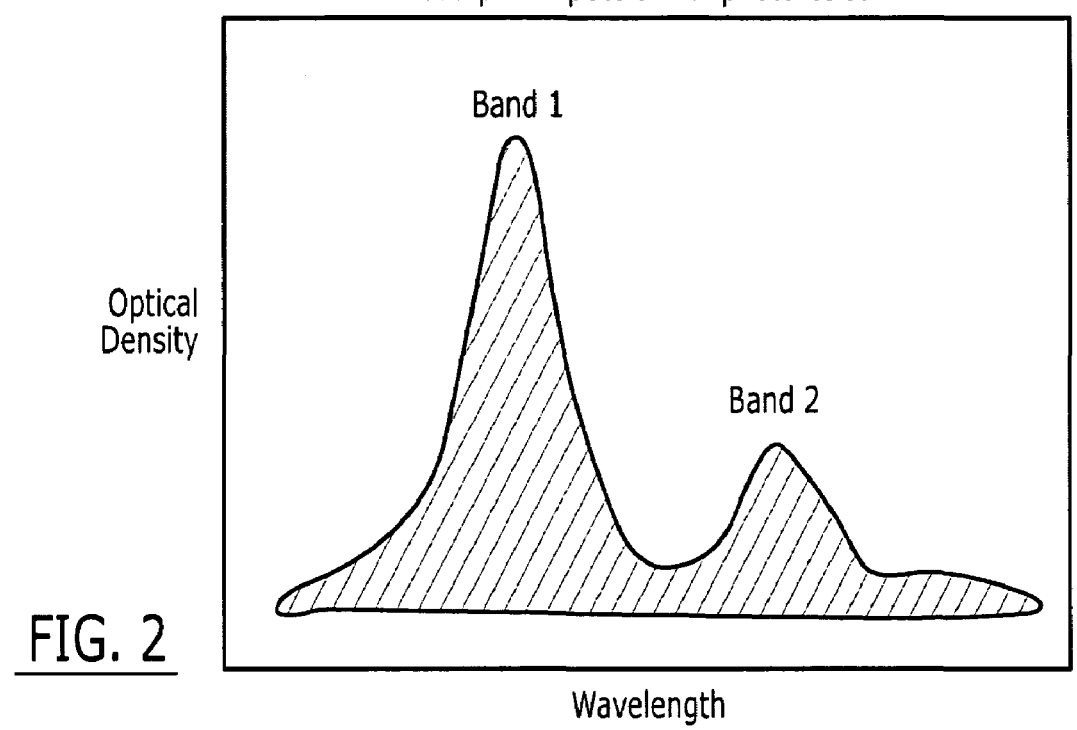
FIG. 2 is a graphical representation of the absorption spectrum of an exemplary photoresist coating.

While the polychromatic mask 12 can be utilized repeatedly in order to form the same three-dimensional patterns in different photoresist coatings 24, a mold of the three-dimensional pattern can be created from a photoresist coating as shown in block 54 of FIG. 2. The mold may then be subsequently utilized to directly form polymer coatings having the same desired three-dimensional pattern without requiring selective illumination and then subsequent processing of a photoresist coating of the type described above. In this regard, the mold may be formed of various materials that are utilized to fill the three-dimensional pattern that has been defined within the photoresist coating as a result of the illumination of the photoresist coating through a polychromatic mask in accordance with embodiments of the present invention. In one embodiment, the mold is formed of a silicone elastomer, such as an epoxy, a polyurethane or an acrylic material. Alternatively, the mold may be formed of a metal that is electroformed on the surface of the photoresist coating.

As described above, a photolithographic method and apparatus are provided for leveraging the different absorption characteristic of a photoresist coating 24 to light having different wavelengths in order to define multilayer, three-dimensional patterns or structures within the photoresist coating. Even though the resulting pattern varies with depth, the sidewalls of the resulting three-dimensional structure are either vertical or much closer to vertical than corresponding sidewalls formed in accordance with conventional monochromatic techniques. Moreover, the photolithographic method and apparatus of the present invention is advantageous in that the exposure process is a single step as opposed to an iterative process with its attendant disadvantages relating to complexity, alignment and the like.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A photolithographic method comprising:
    positioning a mask defining a plurality of different regions relative to a photoresist coating, wherein a first region of the mask permits light of a first wavelength to pass therethrough while blocking light of second wavelength, and wherein a second region of the mask permits light of the second wavelength to pass therethrough while blocking light of the first wavelength;
    positioning a micro-lens array to receive light including the first and second wavelengths following propagation through the mask and prior to exposing the photoresist coating;
    illuminating the mask with light including both the first and second wavelengths such that light of the first and second wavelengths is selectively passed through the first and second regions of the mask, respectively, wherein illuminating the mask comprises illuminating each of the first and second regions of the mask with light having both the first and second wavelengths;
    replicating a pattern of light defined by the mask with the micro-lens array a plurality of times and focusing each of the patterns of light produced by the micro-lens array upon a different respective portion of the photoresist coating, wherein each pattern of light produced by the micro-lens array and focused upon a respective portion of the photoresist coating is smaller than the mask;
    exposing the photoresist coating to the light of the first and second wavelengths in a pattern defined by and following propagation through the mask with light of the first wavelength being absorbed less by the photoresist coating and therefore propagating further into the photoresist coating than light of the second wavelength; and
    removing a portion of the photoresist coating after exposure of the portion to the light having both the first and second wavelengths.

2. A photolithographic method according to claim 1 further comprising selecting the first and second wavelengths at least partially based upon optical absorption characteristics of the photoresist coating for light having the first and second wavelengths so as to insure that light having the first and second wavelengths will penetrate to different depths within the photoresist coating.

3. A photolithographic method according to claim 1 wherein illuminating the mask with light comprises illuminating the mask with white light.

4. A photolithographic method according to claim 1 further comprising positioning a micro-lens array to receive light including the first and second wavelengths following propagation through the mask and configured to focus the light upon the photoresist coating.

5. A photolithographic method according to claim 1 further comprising:
    developing the photoresist coating following exposure to light having the first and second wavelengths; and
    wherein removing a portion of the photoresist coating comprises defining a three-dimensional structure.

6. A photolithographic method according to claim 5 further comprising baking the photoresist coating after removing the portion of the photoresist coating.

7. A photolithographic method according to claim 5 further comprising transferring the three-dimensional structure defined by the photoresist coating to a substrate.

8. A photolithographic method according to claim 7 wherein transferring comprises ion milling the substrate in accordance with the three-dimensional structure defined by the photoresist coating.

9. A photolithographic method according to claim 5 further comprising creating a mold of the three-dimensional structure defined by the photoresist.

10. A method comprising:
    positioning a mask defining a plurality of different regions relative to a photoresist coating, wherein a first region of the mask permits light of a first wavelength to pass therethrough while blocking light of second wavelength, and wherein a second region of the mask permits light of the second wavelength to pass therethrough while blocking light of the first wavelength;

positioning a micro-lens array to receive light including the first and second wavelengths following propagation through the mask; and replicating a pattern of light defined by the mask with the micro-lens array to focus a plurality of patterns of light produced by the micro-lens array upon different respective portions of a photoresist coating, wherein the pattern of light produced by a respective micro-lens array element and focused upon a respective portion of the photoresist coating being smaller than the mask.

11. A method according to claim 10 further comprising selecting the first and second wavelengths at least partially based upon optical absorption characteristics of the photoresist coating for light having the first and second wavelengths so as to insure that light having the first and second wavelengths will penetrate to different depths within the photoresist coating.

12. A method according to claim 11 further comprising:

illuminating the mask with light including both the first and second wavelengths; and exposing the photoresist coating to the light of the first and second wavelengths in a pattern defined by the mask with light of the first wavelength being absorbed less by the photoresist coating and therefore propagating further into the photoresist coating than light of the second wavelength.

13. A method according to claim 12 wherein illuminating the mask with light comprises illuminating the mask with white light.

14. A method according to claim 12 further comprising:

developing the photoresist coating following exposure to light having the first and second wavelengths; and removing a portion of the photoresist coating dependent upon the exposure of the photoresist coating to light having the first and second wavelengths such that remaining portions of the photoresist coating define a three-dimensional structure.

15. A method according to claim 14 further comprising baking the photoresist coating after removing the portion of the photoresist coating.

16. A method according to claim 14 further comprising transferring the three-dimensional structure defined by the photoresist coating to a substrate.

17. A method according to claim 16 wherein transferring comprises ion milling the substrate in accordance with the three-dimensional structure defined by the photoresist coating.

18. A method according to claim 14 further comprising creating a mold of the three-dimensional structure defined by the photoresist coating.

19. A photolithographic apparatus comprising:

a polychromatic mask defining a plurality of different regions, wherein a first region of said mask is configured to permit light of a first wavelength to pass therethrough while blocking light of second wavelength, wherein a second region of said mask is configured to permit light of the second wavelength to pass therethrough while blocking light of the first wavelength, and wherein said polychromatic mask comprises a transparent substrate with the first and second regions having first and second colors, respectively; and a micro-lens array positioned to receive light including the first and second wavelengths following propagation through said polychromatic mask and configured to focus the light upon a photoresist coating, wherein the micro-lens array comprises a plurality of lenslets configured to replicate a pattern of light defined by the mask a plurality of times and to focus each of the patterns of light upon a different respective portion of the photoresist coating, wherein each pattern of light produced by a respective lenslet of the micro-lens array and focused upon a respective portion of the photoresist coating is smaller than the mask.

20. A photolithographic apparatus according to claim 19 wherein the first and second regions of said polychromatic mask are imprinted with the first and second colors, respectively.

21. A photolithographic method according to claim 1 further comprising providing the mask with the first and second regions of the mask having first and second colors, respectively.

22. A photolithographic method according to claim 21 wherein providing the mask comprises imprinting the mask with the first and second colors.

23. A photolithographic method according to claim 22 wherein imprinting the mask comprises imprinting the mask with the first and second colors with an inkjet printer.

24. A photolithographic method according to claim 21 wherein providing the mask comprises coloring the mask with the first and second colors by hand.

25. A method according to claim 10 further comprising providing the mask with the first and second regions of the mask having first and second colors, respectively.

26. A method according to claim 25 wherein providing the mask comprises imprinting the mask with the first and second colors.

27. A method according to claim 26 wherein imprinting the mask comprises imprinting the mask with the first and second colors with an inkjet printer.

28. A method according to claim 25 wherein providing the mask comprises coloring the mask with the first and second colors by hand.

* * * * *